United States Patent [19]

Merry et al.

[11] Patent Number: 5,648,722

[45] Date of Patent: Jul. 15, 1997

[54] APPARATUS AND METHOD FOR DETERMINING THE STATE OF AN ELECTRICAL SWITCH WITHIN AN HVAC SYSTEM

[75] Inventors: Nir Merry, Albany; Jack Francis Hammons, Walnut Creek, both of Calif.

[73] Assignee: Gas Research Institute, Chicago, Ill.

[21] Appl. No.: 508,599

[22] Filed: Jul. 28, 1995

[51] Int. Cl.$^6$ ................................................. G01R 31/02
[52] U.S. Cl. ........................... 324/417; 324/418; 324/500; 340/644
[58] Field of Search ........................... 324/415, 417, 324/418, 500; 340/644

[56] References Cited

U.S. PATENT DOCUMENTS

| | | | |
|---|---|---|---|
| 3,346,855 | 10/1967 | Bishop | 324/418 X |
| 4,398,144 | 8/1983 | Heidemann | 324/527 |
| 4,420,810 | 12/1983 | Hernandez et al. | 340/618 X |
| 4,672,310 | 6/1987 | Sayed | 324/133 |
| 4,695,246 | 9/1987 | Beilfuss et al. | 431/31 |
| 4,703,747 | 11/1987 | Thompson et al. | 126/112 |
| 4,723,703 | 2/1988 | Thompson | 236/11 |
| 4,789,330 | 12/1988 | Ballard et al. | 431/75 |
| 4,887,767 | 12/1989 | Thompson et al. | 236/1 EB |
| 4,918,390 | 4/1990 | Ziv et al. | 324/415 |
| 4,929,932 | 5/1990 | Shipkowski | 340/644 |
| 4,976,459 | 12/1990 | Lynch | 236/11 |
| 5,186,386 | 2/1993 | Lynch | 236/11 |
| 5,197,664 | 3/1993 | Lynch | 236/11 |
| 5,372,120 | 12/1994 | Swilik, Jr. et al. | 126/116 A |
| 5,379,752 | 1/1995 | Virgil, Jr. et al. | 126/116 A |

Primary Examiner—Kenneth A. Wieder
Assistant Examiner—Glenn W. Brown
Attorney, Agent, or Firm—Dick and Harris

[57] ABSTRACT

An apparatus and method for determining the state of a switch for use in an HVAC system. The apparatus and method are advantageously configured for use within a heating, ventilation and air conditioning (HVAC) system, in which the sensing of the state of safety switches external to a controller is desirable. A current sensor coupled in series between a current source, a safety switch, and a current load, detects the flow of current from the current source and through the switch and load. A status signal, indicative of the flow of current through the current sensor, is generated for sampling by a microprocessor. The presence or absence of current flow through the current sensor provides an indication as to whether the remotely-located switch is in an open or closed state.

13 Claims, 2 Drawing Sheets

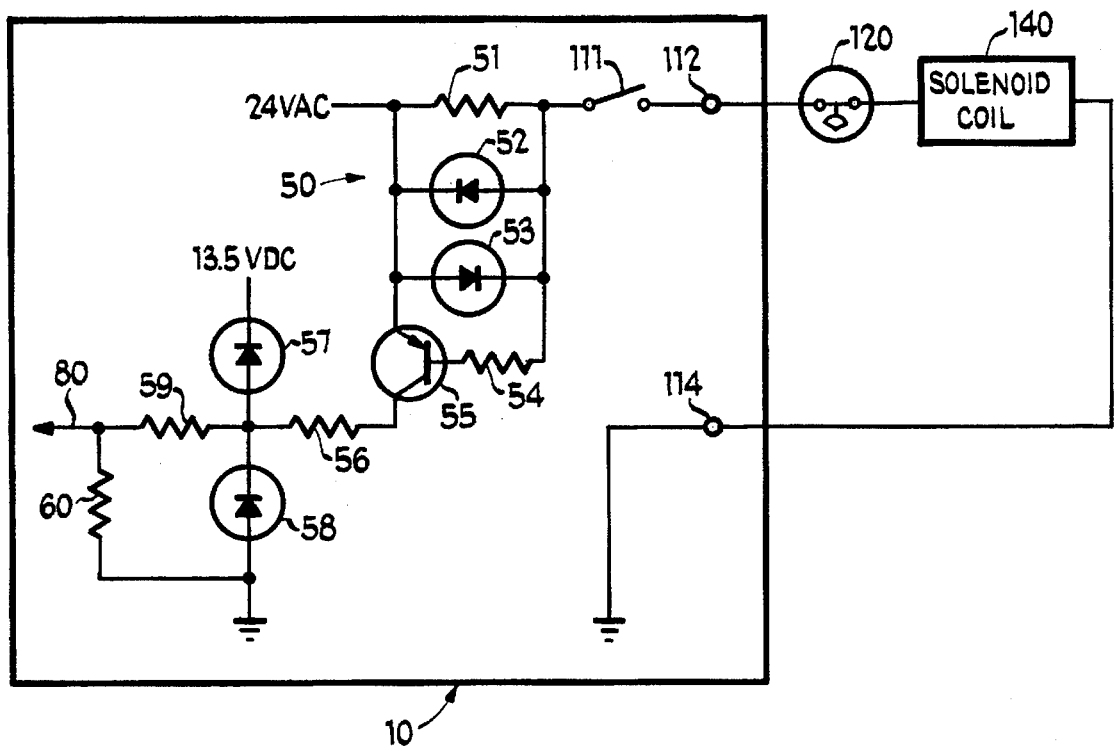
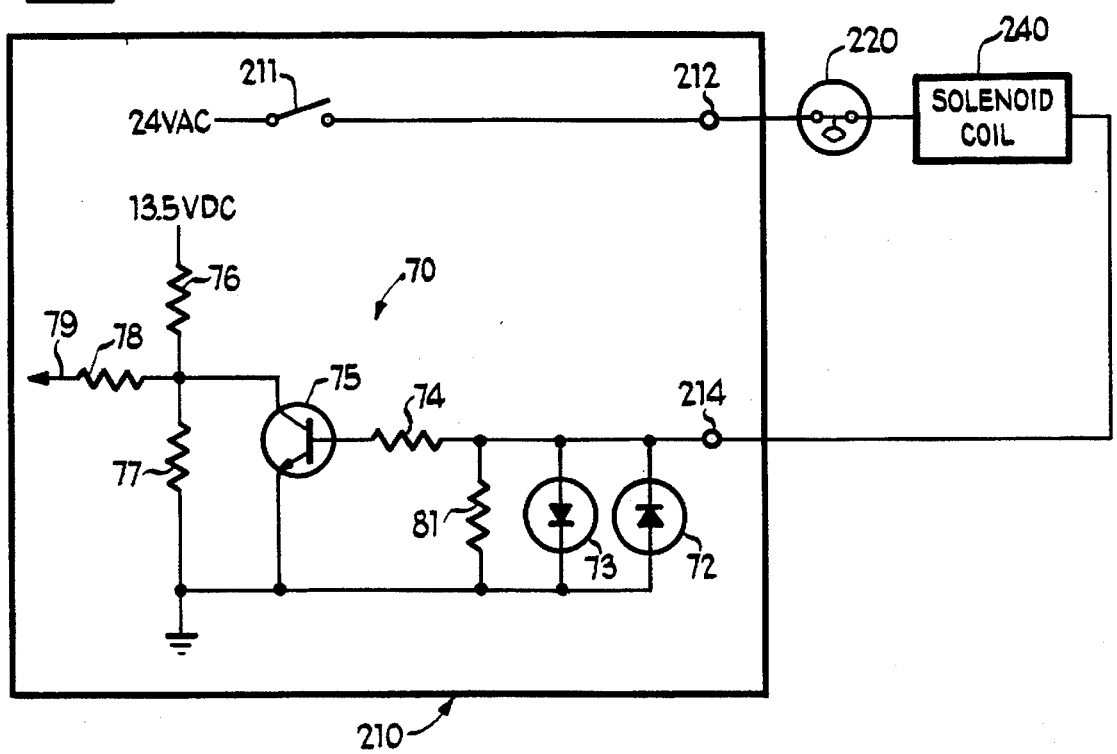

APPARATUS AND METHOD FOR DETERMINING THE STATE OF AN ELECTRICAL SWITCH WITHIN AN HVAC SYSTEM

BACKGROUND OF THE INVENTION

1. Field of the Invention

The present invention relates in general to electrical switches, and, more particularly, to an apparatus and method for determining whether a switch, for use in an HVAC system, is in an electrically closed state or an electrically open state.

2. The Prior Art

In indoor environmental conditioning systems for spaces, such as HVAC (heating, ventilating and air conditioning) systems for residences and commercial spaces, external switches, such as automatic safety switches, are frequently coupled to control units. For example, HVAC systems typically employ such automatic safety switches as high pressure sensor switches, low pressure sensor switches, and flame rollout sensor switches. Each of these switches will automatically transition from a normally closed state to an open state upon the detection of an unsafe condition, such as a high pressure condition, a low pressure condition, or a flame exiting the combustion chamber, respectively. Generally, it is desirable for the state of these automatic, external safety switches to be sensed by an HVAC controller. For example, an HVAC controller may include a visual display, or other signalling circuitry, in order to provide an indication of the present state of these safety switches. Moreover, an HVAC controller may take certain actions, such as the institution of diagnostic or shut-down procedures, upon sensing a transition of the state of an external safety switch.

Often, safety switches are positioned at a remote location, relative to the HVAC controller. For example, an HVAC controller may be located proximate a furnace, which, for example, may be located in a basement of a building; while an associated automatic safety switch may be located proximate a compressor within an air conditioning unit, which, for example, may be located on the roof of the same building.

One type of prior art system for detecting the state of a switch is shown in FIG. 1 of the present application. In such prior art systems, a status conductor, coupled proximate a terminal of a safety switch, or a group of safety switches wired in series, is routed back to the HVAC controller. Voltage sensing circuitry within the HVAC controller detects whether a voltage is present or absent at the sensed location proximate the safety switch, and, accordingly, whether the safety switch, or any switch within the group of safety switches wired in series, is in a closed or open state. While the prior art system shown in FIG. 1 provides a means of detecting the state of an external switch, additional switch status conductors between the sensed switch and the status sensing circuitry are necessitated. As a result, cabling costs are increased, especially when, for example, the sensed automatic safety switches are located an appreciable distance from the associated HVAC controller. Moreover, the presence of the additional status signal conductor creates an additional failure mechanism for the system.

Another prior art system for determining the status of an external safety switch in an HVAC environment, is disclosed in U.S. Pat. No. 5,372,120 to Swilik, Jr. et al. This reference discloses coupling an external safety switch between the power supply and return terminals of a controller unit. The return terminal of the controller unit is also coupled to a microprocessor, which senses the presence or absence of a return voltage (as opposed to current flow), in order to determine whether the external safety switch is in an open or closed state. While this configuration does not require the additional, external status conductor shown in FIG. 1, it does require that the controller unit's return terminal be isolated from system ground.

Accordingly, it is desirable to provide an apparatus and method for determining a state of a switch by sensing current flow (as opposed to voltage), for use in an HVAC system, wherein an additional external conductor is not required in order to sense the state of the switch; and wherein a terminal of the sensed safety switch may be coupled to system ground.

SUMMARY OF THE INVENTION

The present invention comprises an apparatus for determining a state of a switch, for use in an HVAC system, having an electrically closed state and an electrically open state. Means, electrically coupled to the switch, provide a source of electrical current. Additional means, electrically coupled to the switch, provide a current load. Further means, electrically coupled to at least one of the current source means, current load means, and switch means, detect current flow, and, in turn, provide a signal indicative of the state of the switch.

In a preferred embodiment, the current flow detecting means is electrically coupled to the current source means. In another preferred embodiment, the current flow detecting means is electrically coupled to the load means.

Also, in a preferred embodiment, the current source means and the current flow detecting means are located within an HVAC control unit, while the switch and load means are each located external to the HVAC control unit.

The present invention also comprises a method for determining the state of a switch. The method comprises the steps of: providing a source of electrical current; electrically coupling the electrical current to the switch; providing a current load; electrically coupling the current load to the switch; detecting current flow to the switch; and providing a signal indicative of the detected current flow through the switch, and, in turn, the state of the switch.

BRIEF DESCRIPTION OF THE DRAWINGS

FIG. 3 of the drawings is a schematic diagram of a preferred embodiment of the present invention, showing, in particular, the supply side current sensor; and FIG. 4 of the drawings is a schematic diagram of another preferred embodiment of the present invention, showing, in particular, the return side current sensor.

BEST MODE FOR PRACTICING THE INVENTION

Figure 1:
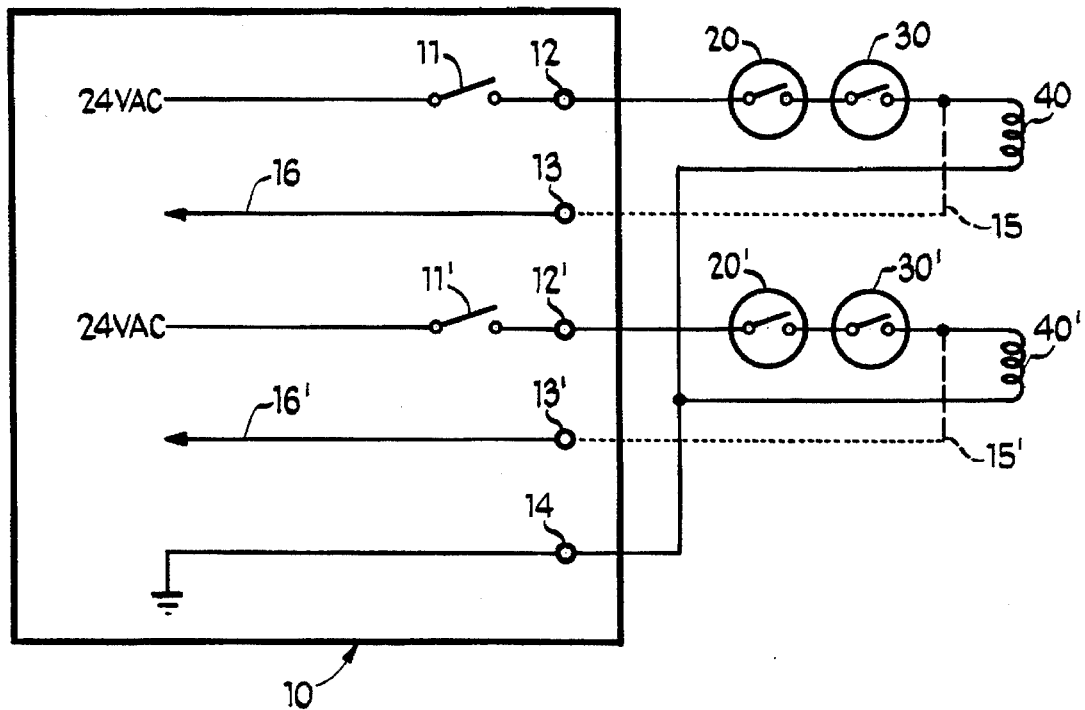
FIG. 1 of the drawings is a schematic diagram of a prior art HVAC system, showing, in particular, the additional conductor used to sense the state of the safety switches.

A prior art system for determining the state of an electrical switch is shown in FIG. 1 as comprising HVAC controller 10, low pressure switches 20 and 20', high pressure switches 30 and 30', and solenoid coils 40 and 40'. Control relays 11 and 11' within controller 10 each couple a 24 volt alternating current power supply to supply terminals 12 and 12', respectively. Wiring, external to controller 10, couple supply terminal 12 in series with low pressure switch 20, high pressure switch 30 and solenoid coil 40. Similarly, additional external conductors couple supply terminal 12' in series with low pressure switch 20', high pressure switch 30', and solenoid coil 40'. Moreover, further external wiring couples solenoid coils 40 and 40' together to common terminal 14, which, in turn, is coupled to system ground via controller 10. One end of switch state status conductor 15 is coupled between high pressure switch 30 and solenoid coil 40. The other end of switch state status conductor 15 is coupled to return terminal 13, within controller 10. Similarly, one end of switch state status conductor 15' is coupled between high pressure switch 30' and solenoid coil 40'. The other end of switch state status conductor 15' is coupled to return terminal 13'. When control relay 11, low pressure switch 20 and high pressure switch 30 are all closed, a 24 VAC voltage will be present at return terminal 13, as indicated by status line 16, internal to controller 10. Similarly, when control relay 11 ', low pressure switch 20' and high pressure switch 30' are all in a closed state, a 24 VAC voltage will be present at return terminal 13', as indicated by status signal 16'. Should any of control relay 11 ', low pressure switch 20' and high pressure switch 30' be in an open state, return terminal 13' will be in a "floating" condition, indicating that at least one of these switches is in an open condition.

Figure 2:
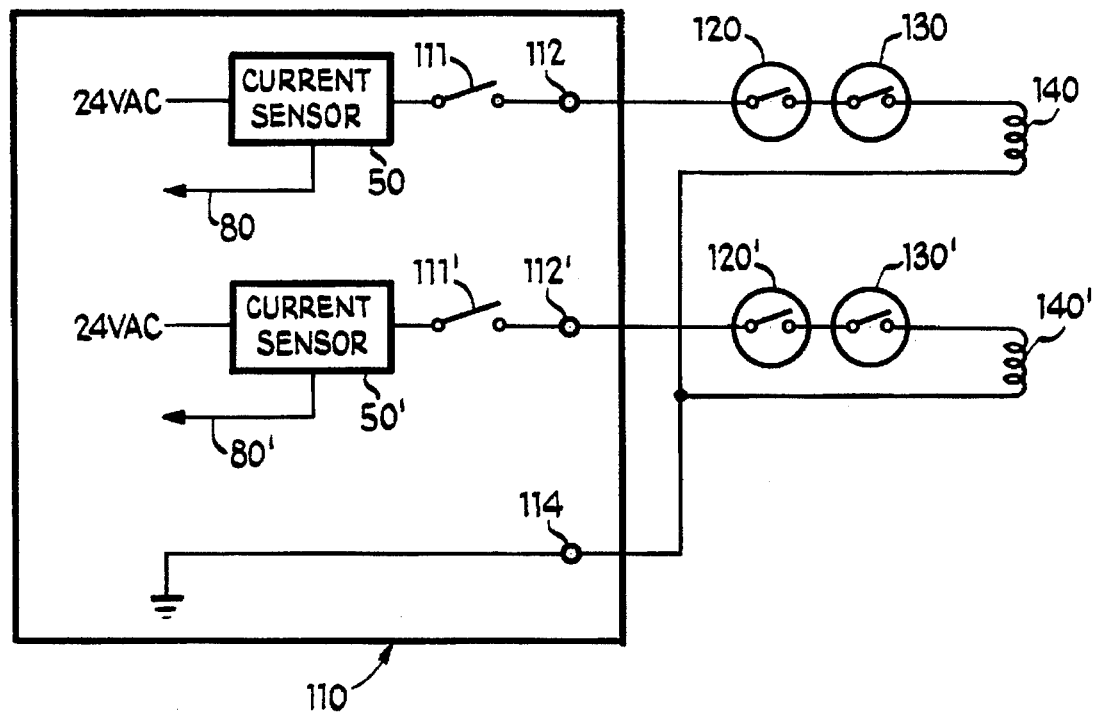
FIG. 2 of the drawings is a schematic diagram of an HVAC system employing the present invention.

An HVAC controller employing the present invention is shown in FIG. 2. As can be seen, the external switch state status conductors 15 and 15', as well as the associated return terminals 13 and 13', all present in the prior art system of FIG. 1, are not required by a system employing the present invention. Instead, supply side current sensors 50 and 50', within HVAC controller 110, are placed in series between the 24 volt alternating current power supply and control relays 111 and 111', respectively. When control relay 111, low pressure switch 120, and high pressure switch 130 are all in a closed state, solenoid coil 140 will provide a load to the power supply, and current will flow from the 24 VAC power supply, through current sensor 50, through switches 111, 120 and 130, through solenoid coil 140, to common terminal 114 and system ground. Current sensor 50 outputs a signal 80, indicative of whether or not current is presently passing through the sensor. In a preferred embodiment, signal 80 is coupled to an input port of a microprocessor.

When any of control relay 111, low pressure switch 120, and high pressure switch 130 are in an open state, such as, for example, when an under-pressure condition within the combustion chamber of a furnace causes low pressure switch 120 to open, an open circuit is created, and no current will pass through current sensor 50. Accordingly, current sensor 50 will output a status signal 80 indicative of an absence of current flow. When all of these switches are in a closed state, however, current will flow through current sensor 50, causing current sensor 50 to output a status signal 80 indicative of the presence of current flow.

In this manner, a microprocessor coupled to status signal 80 can periodically poll this signal in order to determine whether a safety switch is in an open or closed state. Alternatively, status signal 80 may be coupled to an interrupt pin of a microprocessor. Moreover, although, in a preferred embodiment, a microprocessor is employed to sense the condition of status signal 80, discrete circuitry may, of course, be substituted.

Similarly, supply side current sensor 50', having an output status signal 80', may be employed to determine the states of safety switches 120' and 130', based upon whether or not current is drawn by solenoid coil 140'.

Accordingly, as compared to the prior art system of FIG. 1, the system of FIG. 2, employing the present invention, allows two separate groups of safety switches, each wired in series and tied to a common, grounded return terminal, to be coupled to an HVAC controller using only three terminals, rather than five terminals as shown in the prior art system of FIG. 1, yet still senses the states of these switches. The requisite switch state status conductors 15 and 15', as well as status terminals 13 and 13' of FIG. 1, are eliminated in the HVAC system of FIG. 2, employing the present invention.

The supply side current sensor 50 of FIG. 2 is shown in detail in FIG. 3 as including resistor 51, wired in series between the 24 VAC power supply and control relay 111. Resistor 51 is preferably of a relatively high wattage and low resistance value, such as 100 ohms, so as to substantially preclude a large voltage drop within current sensor 50. Clamping diodes 52 and 53, arranged in a back-to-back configuration, clamp the voltage drop across resistor 51 to one diode drop (approximately 0.6–0.7 volts). The emitter and base of PNP transistor 55 are coupled in parallel to resistor 51, and diodes 52 and 53. Resistor 54 limits the current to the base of transistor 55, providing protection for the transistor.

When control relay 111 and safety switch 120 are both in a closed state, current will pass from the 24 VAC power supply, through resistor 51, switches 111 and 120, and solenoid coil 140, to common terminal 114 and system ground. Provided at least approximately 10 milliamps of current is drawn by the load of solenoid coil 40, the voltage drop across resistor 51 will be approximately 0.7 volts, causing transistor 55 to switch from an OFF state to an ON state.

Diodes 57 and 58 limit the voltage at the point between the diodes from approximately 14.2 volts (13.5 volts plus one diode drop) to approximately minus 0.7 volts (system ground minus one diode drop). When transistor 55 is OFF, (i.e. when no significant current is passing through resistor 55), the voltage between diodes 57 and 58 will be approximately 0 volts, pulled down by resistors 59 and 60. When transistor 55 is in an ON state, however, the voltage between diodes 57 and 58 will follow the positive portion of the sine wave created by the 24 VAC power supply. Accordingly, the signal between diodes 57 and 58 will be a clipped sine-wave, varying from 0 volts to approximately 14.2 volts in potential. Resistor 56 provides current limiting protection to a microprocessor, preferably coupled to status signal 80. Resistors 59 and 60 collectively form an approximately divide-by-3 divider, scaling the voltage between diodes 57 and 58 to a TTL-compatible range. If the level of status signal 80 is consistently at approximately 0 volts, and if control switch 111 is closed, it can be determined that safety switch 120 is in an open state. If, however, status signal 80 is periodically at a logic-high level, approximately 4.7 volts, safety switch 120 may be deemed to be in a closed state. Accordingly, supply side current sensor 50 provides an indication, via status signal 80, of the current state of safety switch 120.

Although resistor 51 is shown having a value of approximately 100 ohms, other values may be substituted, in order to vary the minimum quantity of current flow which is to be sensed by supply current sensor 50.

Another preferred embodiment of the present invention, employing a return side current sensor 70 within HVAC controller 210, (rather than the supply current sensor of FIG. 3) is shown in FIG. 4. In this embodiment, the supply side of solenoid coil 240 is coupled to supply terminal 212 and the return side of solenoid coil 240, coupled to return terminal 214, is not coupled directly to system ground. Instead, the return side of solenoid coil 240 is coupled to current sensor 70. When either control relay 211 or safety switch 220 are in an open state, NPN transistor 75 will be in an OFF state. At this time, a logic high TTL level will be supplied to a sensing microprocessor, via status signal 79. Resistors 76 and 77 collectively form a divider network, dividing the 13.5 DC voltage by approximately one-third, to approximately 4.5 volts. When, however, both safety switch 220 and control relay 211 are in a closed state, transistor 75 will be turned ON, conducting current from the collector to the emitter. This, in turn, will pull the voltage at status signal 79 down to a logic 0 TTL level. Resistor 78 provides current limitation, protecting the microprocessor input circuitry, preferably coupled to status signal 79. Similarly, resistor 74 limits the current into the base of transistor 75, protecting the transistor. Finally, diodes 72 and 73 are protective diodes, preventing large input swings to transistor 75 and, in turn, protecting against base-emitter reverse breakdown.

As shown in FIG. 4, a relatively small-valued resistor 81, such as a 100 ohm resistor, may be wired in parallel with diodes 72 and 73, so as to adjust the minimum quantity of current flow for which return side current sensor 70 is responsive. A 100 ohm resistor will cause return side current sensor 70 to respond to a current flow of approximately 10 milliamperes or greater. Of course, the valve of resistor 81 may be modified so as to vary the minimum current flow to which return side current sensor 70 is responsive.

Although, in the illustrated embodiments, PNP and NPN transistors are employed as switches within the current sensing circuitry, other components are also contemplated. For example, a field effect transistor (FET), or an analog switch, may alternatively be used. Moreover, while in a preferred embodiment, a current load in the form of a solenoid coil is employed, other inductive/resistive elements may be substituted. For example, depending upon the application, a resistor, a relay coil, or a heating element, may provide the necessary current load in order to trip the current sensing circuitry.

The foregoing description and drawings merely explain and illustrate the invention, and the invention is not limited thereto except insofar as the appended claims are so limited, as those skilled in the art who have the disclosure before them will be able to make modifications and variations therein without departing from the scope of the invention.

We claim:

1. An apparatus for determining a state of system, the apparatus comprising:
    an electrical load that forms a portion of the HVAC system;
    a first switch having an electrically closed state and an electrically open state connected in series with the electrical load, the state of the first switch being controlled by conditions in the HVAC system directly associated with the electrical load;
    means electrically coupled in series with the first switch for providing electrical current;
    means electrically coupled in series with the current providing means, electrical load, and first switch for detecting current flow, and, in turn, providing a signal indicative of the state of the HVAC system.

2. The apparatus according to claim 1, wherein the current flow detecting means is electrically coupled to the current providing means.

3. The apparatus according to claim 1, wherein the current flow detecting means is electrically coupled to the electrical load.

4. The apparatus according to claim 1, wherein the current providing means and current flow detecting means are located within a furnace control unit, and the first switch and electrical load are located external to the furnace control unit.

5. The apparatus according to claim 1 wherein the HVAC system includes a furnace including a combustion chamber having an internal pressure, the first switch is in the electrically closed state unless the internal pressure falls below a predetermined pressure.

6. The apparatus according to claim 1 wherein the HVAC system includes a furnace including a combustion chamber having an internal pressure, the first switch is in the electrically closed state unless the internal pressure rises above a first predetermined pressure.

7. The apparatus according to claim 6 further comprising a second switch having an electrically closed state and an electrically open state in series with the first switch.

8. The apparatus according to claim 7 wherein the state of the second switch being controlled by conditions in the HVAC system directly associated with the electrical load, the second switch is in the electrically closed state unless the internal pressure falls below a second predetermined pressure wherein the second predetermined pressure is lower than the first predetermined pressure.

9. A method for determining a state of an HVAC system, the method comprising the steps of:
    providing a source of electrical current;
    providing an electrical load as part of the HVAC system;
    providing a switch having an electrically closed state and an electrically open state, the state of the switch being controlled by conditions in the HVAC system directly associated with the electrical load;
    electrically coupling in a series circuit the electrical current source, switch and electrical load;
    detecting current flow through the series circuit; and
    providing a signal indicative of the detected current flow through the series circuit, and, in turn, the state of the HVAC system.

10. A method for monitoring the state of a switch within an HVAC system, the method comprising the steps of:
    providing a source of electrical current within a controller housing;
    providing an electrical load outside the controller housing as part of the HVAC system;
    providing a first switch outside the controller housing, the first switch having an electrically closed state and an electrically open state, the state of the first switch being controlled by conditions in the HVAC system directly associated with the electrical load;
    monitoring the state of the first switch from within the controller housing; and
    requiring no additional electrical connections to the controller housing to perform the step of monitoring by electrically coupling in series the electrical current source, first switch and electrical load.

11. The method according to claim 10 wherein the HVAC system includes a furnace having a combustion chamber having an internal pressure, the method comprising the additional step of controlling the first switch based on the internal pressure of the furnace combustion chamber.

12. The method according to claim 11 further comprising the step of providing a second switch outside the controller housing, the second switch having an electrically closed state and an electrically open state, the state of the second switch being controlled by conditions in the HVAC system directly associated with the electrical load.

13. The method according to claim 10 further comprising the additional steps of:

locating the electrical load distally from the controller housing; and locating the first switch proximate the electrical load.

* * * * *

UNITED STATES PATENT AND TRADEMARK OFFICE
CERTIFICATE OF CORRECTION

PATENT NO. :  5,648,722
DATED      :  July 15, 1997
INVENTOR(S):  Merry et al.

It is certified that error appears in the above-indentified patent and that said Letters Patent is hereby corrected as shown below:

Col. 5, line 47                    After "a state of" and before "system" insert -- an HVAC --.

Signed and Sealed this

Eleventh Day of November, 1997

*Attest:*

BRUCE LEHMAN

*Attesting Officer*         *Commissioner of Patents and Trademarks*